United States Patent
Luzanov

(10) Patent No.: US 8,610,528 B1
(45) Date of Patent: Dec. 17, 2013

(54) VERTICAL PCB SURFACE MOUNT INDUCTORS AND POWER CONVERTERS

(71) Applicant: VLT, Inc., Sunnyvale, CA (US)

(72) Inventor: Sergey Luzanov, Pelham, NH (US)

(73) Assignee: VLT, Inc., Sunnyvale, CA (US)

( * ) Notice: Subject to any disclaimer, the term of this patent is extended or adjusted under 35 U.S.C. 154(b) by 0 days.

(21) Appl. No.: 13/724,241

(22) Filed: Dec. 21, 2012

Related U.S. Application Data

(62) Division of application No. 12/690,525, filed on Jan. 20, 2010, now Pat. No. 8,344,842.

(51) Int. Cl.
*H01F 27/29* (2006.01)
(52) U.S. Cl.
USPC .......................................... 336/192
(58) Field of Classification Search
USPC .............. 336/65, 83, 192, 200, 232; 361/760–766; 29/602.1
See application file for complete search history.

(56) References Cited

U.S. PATENT DOCUMENTS

| | | | |
|---|---|---|---|
| 2,786,969 A | 3/1957 | Blitz | 317/101 |
| 3,065,383 A | 11/1962 | Guillemot | |
| 3,087,096 A | 4/1963 | Jorgensen | 317/101 |
| 3,614,541 A | 10/1971 | Farrand | 317/101 |
| 3,812,442 A | 5/1974 | Muckelroy | 336/83 |
| 3,899,720 A | 8/1975 | Peterson | 317/101 |
| 4,426,689 A | 1/1984 | Henle et al. | 365/52 |
| 4,502,098 A | 2/1985 | Brown et al. | 361/383 |
| 4,574,331 A | 3/1986 | Smolley | 361/393 |
| 5,266,833 A | 11/1993 | Capps | 257/690 |
| 5,451,815 A | 9/1995 | Taniguchi et al. | 257/696 |
| 3,268,772 A | 8/1996 | Kamei et al. | |
| 5,545,924 A | 8/1996 | Contolatis et al. | 257/724 |
| 5,629,839 A | 5/1997 | Woychik | 361/803 |
| 5,986,886 A | 11/1999 | Sasov | 361/704 |
| 6,040,983 A | 3/2000 | Baudouin et al. | 361/760 |
| 6,087,723 A | 7/2000 | Kinsman et al. | 257/727 |
| 6,124,778 A | 9/2000 | Rowley et al. | 336/200 |
| 6,246,016 B1 | 6/2001 | Roessler et al. | 174/261 |
| 6,249,205 B1 | 6/2001 | Meadors et al. | 336/200 |
| 6,292,081 B1 | 9/2001 | Armfield et al. | 336/65 |
| 6,800,942 B1 | 10/2004 | Kinsman | 257/777 |
| 6,930,893 B2 | 8/2005 | Vinciarelli | 363/17 |
| 7,361,844 B2 | 4/2008 | Vinciarelli et al. | 174/260 |
| 7,420,262 B2 | 9/2008 | Bauer et al. | 257/620 |
| 7,663,460 B2 | 2/2010 | Suzuki | 336/61 |
| 2007/0285200 A1 | 12/2007 | Hsieh | 336/83 |

*Primary Examiner* — Tuyen Nguyen
(74) *Attorney, Agent, or Firm* — Fish & Richardson P.C.

(57) ABSTRACT

A vertical PCB inductive device is adapted to be surface mount soldered to a substrate. The inductive device may comprise a transformer having a plurality of windings or one or more discrete inductive devices. The inductive device, being amenable to volume production, may also provide cost savings by reducing the number of layers and the PCB area otherwise required by planar magnetics in a power converter. A power converter may be fashioned to be vertically oriented and surface mount soldered to a substrate such as a customer PCB.

20 Claims, 6 Drawing Sheets

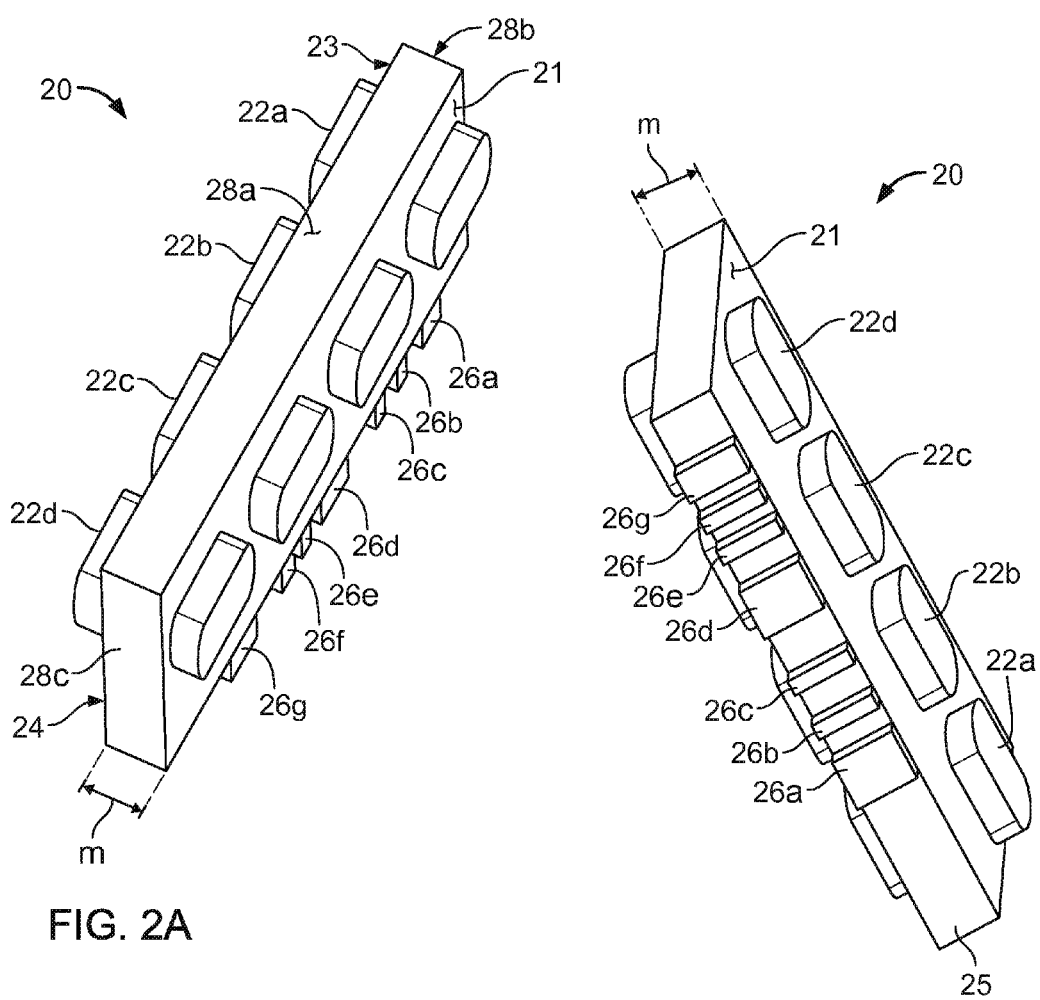
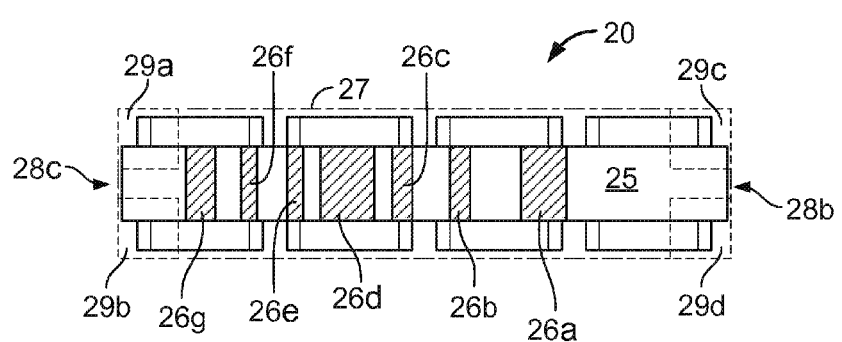
FIG. 2A
FIG. 2B
FIG. 2C

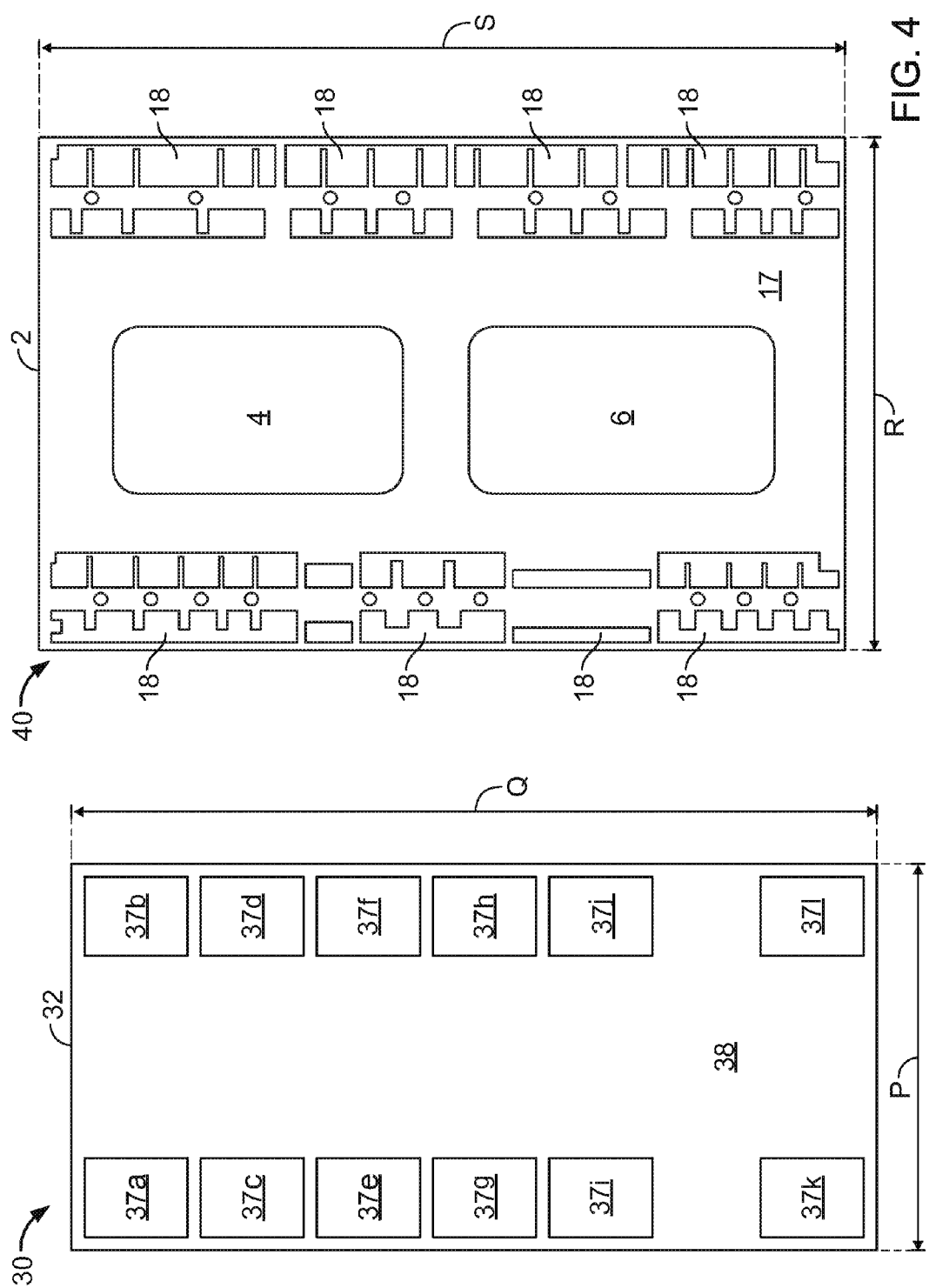

VERTICAL PCB SURFACE MOUNT INDUCTORS AND POWER CONVERTERS

CROSS REFERENCE TO RELATED APPLICATIONS

Pursuant to 35 USC §121, this application is a divisional application and claims the benefit of prior U.S. application Ser. No. 12/690,525, filed on Jan. 20, 2010, which is incorporated by reference in its entirety.

TECHNICAL FIELD

The present invention generally relates to power converters and printed circuit board ("PCB") inductive components, and more particularly to a vertical printed circuit board inductor module adapted for surface mounting to a substrate.

BACKGROUND

An inductor is a passive electronic component that stores energy (measured in henrys (H)) in the form of a magnetic field. In its simplest form, an inductor consists of a wire loop or coil, and the inductance is directly proportional to the number of turns in the coil. Inductance also depends on factors such as the radius of the coil and the type, e.g. magnetic permeability, of material, around which the coil is wound, i.e. the core. An inductor impedes the flow of high-frequencies in an alternating current (AC) circuit, and thus may be used as surge protectors to choke off high-frequency shifts. An inductor may also be connected in series or parallel with a capacitor to provide discrimination against unwanted signals, which is advantageous for use in wireless communications applications. In addition, inductors are used in the power supplies of electronic equipment of all types, including computers and their peripherals. In these systems, simple inductors and more complex coupled inductors such as multi winding transformers, may be used in the power train of switching power converters such as in the buck, boost, buck-boost, forward, and flyback topologies and also in filters helping to smooth out rectified AC, providing pure, battery-like direct current (DC).

Inductors can be manufactured as a surface mount device ("SMD"), which is a device that is mounted directly to the surface of a PCB. For example, the inductor is placed on the surface of the PCB and then the assembly is moved through an oven in a solder reflow process. The temperatures of the oven are sufficiently high to liquefy solder placed between the inductor and the PCB, and after the PCB is removed from the oven and cools, the solder hardens to provide a mechanical and electrical connection. Conventional chip-type surface mount inductors may be rectangular, and the wire surrounding the core (the windings) may be encapsulated in a plastic or other non-conductive material. Electrically conductive terminals on one or more end portions of the surface mount inductor are exposed for connection to contacts on the PCB. Such packaged inductors consume a large amount of space on a PCB, and space considerations are of the utmost importance in consumer electronics, portable devices, and many other communication devices.

In an effort to save space and increase reliability, planar magnetic components such as inductors and transformers may be constructed using PCB manufacturing techniques, wherein the windings and individual winding turns are conductive traces patterned in one or more of the conductive layers of a multilayer PCB. The resulting assembled planar magnetic PCB inductor has a smaller mounting footprint than an inductor having a conventional winding, and the traces that form the windings have proven to be more reliable than prior art windings because the chances of shorting over adjacent turns of the winding is reduced.

An example of a power converter which uses a planar magnetic structure is described and shown in Vinciarelli, Power Converter Package and Thermal Management, U.S. Pat. No. 7,361,844 B2 (assigned to VLT, Inc., Sunnyvale, Calif. and incorporated here by reference) (the "VIC patent"). The VIC patent shows in FIGS. 5A and 5B a power converter including a PCB 442, magnetic core structures 422a, 422b, and additional power conversion circuitry in a package having an upper portion and a lower portion that respectively enclose circuitry on a top surface and a bottom surface of the circuit board. The lower portion encloses a smaller region than that of the upper portion, and the regions are arranged to define an overhang region. Interface contacts on the bottom surface in the overhang region are provided for making electrical connections to an external circuit board.

Power converters that must satisfy low voltage and high current capacity requirements can be expensive to make using planar magnetics because the windings of the inductor or transformer design may require a substantial number of PCB layers, and the overall cost of the converter using such an inductor or transformer formed in the multilayer PCB may be proportional to the number of layers and the amount of conductive material, such as copper, used in each layer, and the PCB area. For example, in order to handle a high current of over 40 amperes with a two or three turn winding with low loss, a multilayer PCB could be composed of eight to ten layers or more that may require approximately four ounces of copper. Furthermore, it is difficult to manufacture such a multilayer PCB to include both inductors and additional electrical circuitry, which further increases the cost.

In Electronic Module Structure, U.S. Pat. No. 2,786,969, Blitz discloses a composite electric component module that includes a plurality of wafer elements having flat, component-supporting surfaces, and riser members that are box-shaped with angularly extending edges. When the structure is formed the edges of one riser member are adjacent the edges of another to provide a one-piece, box-shaped module structure with the wafer elements disposed between adjacent riser members. Circuit components are carried by the supporting surfaces of the wafer elements, and electrically conductive paths are provided on these surfaces and on the inner surfaces of the riser members.

In Wafer Parametron, U.S. Pat. No. 3,087,096, Jorgensen discloses circuit components in the form of minor modules (parametrons) having elements of construction for participating in the response of an electrical circuit, and which can be assembled in groups to form a major module of a complex device. Each parametron consists of a thin wafer of dielectric material for supporting a printed circuit, the wafer having input tabs formed on a first edge and output tabs formed on another, separate edge. The wafer also supports a ferrite core mounted in a perforation, wherein the windings of the core are appropriately connected to traces of the printed circuit. A described embodiment is a triangular construction consisting of an array of three parametrons, wherein the three parametrons are arranged to form a triangular base. This configuration of parametrons can be utilized as a plug in module, for example, for use as a component of a digital computer.

In Surface Mount Inductor, U.S. Published Patent Application No. 2007/0285200, Hsieh discloses a structure for a surface mount inductor having a decreased height when compared to the prior art. The structure consists of two erected side panels and a central part coupled therebetween forming an H-shaped core. A wire is wound around the central part, two terminals are coupled to the conductor contacts of the core, and a casing forming a chamber is provided for receiving the core.

In Vertical Surface Mount Assembly and Methods, U.S. Pat. No. 6,087,723, Kinsman et al. disclose a vertically mountable semiconductor device assembly that includes a semiconductor device and a mechanism for attaching the semiconductor device to a carrier substrate. In particular, the vertically mountable semiconductor device includes bond pads disposed proximate an edge. The assembly also includes a retainer that engages the semiconductor device, and an alignment device that is attached to a carrier substrate. The alignment device secures the vertically mountable semiconductor device package in an orientation that is perpendicular to the plane of the carrier substrate.

State of the art microprocessors and memory are increasingly faster and smaller in size, and require small footprint components that can deliver low voltages at increasingly higher currents. Thus, there is a need for an improved, cost effective, small footprint inductor module for use with power converter circuitry. Such a device should also be compatible with existing PCB surface mounting techniques and be less expensive than prior art devices.

SUMMARY

In general, one aspect features an apparatus that includes an inductor having a magnetic core and a multilayer PCB. The PCB may include conductive traces that form at least one winding coupled to the magnetic core and contacts electrically connected to the conductive traces for making connections between the winding and a substrate. The contacts may be arranged along one edge of the PCB. The edge may be sufficiently wide to permit stable connection of the inductor to the substrate in a generally orthogonal orientation.

In general, another aspect features a method that includes providing an inductor having a magnetic core on a multilayer PCB. Conductive traces may be provided on at least one layer of the PCB that form a winding coupled to the magnetic core. Contacts electrically connected to the conductive traces may be provided along one edge of the PCB for making connections between the winding and a substrate. The edge of the PCB may be made sufficiently wide to permit stable connection such that the PCB is substantially perpendicular to the substrate.

In general, another aspect features a method of packaging an inductor that includes providing a multilayer PCB having a top surface and a bottom surface and a magnetically permeable core on the multilayer PCB. Conductive traces on at one layer of the PCB may form a winding coupled to the magnetic core. Contacts electrically connected to the conductive traces may be provided along one edge of the PCB for making connections between the winding and a substrate. The edge and the contacts may be made sufficiently wide to permit stable connection of the inductor to the substrate in a generally orthogonal orientation.

Implementations of the apparatus or method may include one or more of the following features. The inductor may be a transformer and the windings may include a primary winding and a secondary winding. The contacts may be surface mount soldered to the substrate. A thermally conductive material may be used to encapsulate the inductor and the PCB while leaving the contacts exposed. A substrate including power conversion circuitry and terminals may be provided. The power conversion circuitry may be electrically connected to the inductor for converting power from an input source for delivery to a load. The substrate may include a number, M, of conductive layers for forming interconnections, and the multilayer PCB may include a number, L, of conductive layers. L may be greater than M. M may be greater than L. A thermally conductive material may be provided on a top surface of the substrate to encapsulate the inductor, the multilayer PCB and the power conversion circuitry. One or more support pads may be provided on the edge of the PCB adjacent to the contacts. The PCB may have a number, L, of conductive layers that depends at least partially on the number of windings of the inductor, and the substrate may include a number, M, of conductive layers for forming interconnections between power conversion circuitry on the substrate and the inductor.

In general, another aspect features an apparatus that includes a first generally rectangular substrate having a thickness, a length and a width defining a first surface and a second surface generally parallel to the first surface. The first and second surfaces may be separated by the thickness. The substrate may comprise a plurality of conductive layers separated by insulating layers and a plurality of surface contacts arranged along a first edge of the substrate defined by the length and the thickness of the substrate. The conductive layers may include conductive traces. Selected ones of the conductive traces may be electrically connected to selected ones of the surface contacts. A plurality of components may be mounted to the substrate. The surface contacts may be configured to be mechanically and electrically connected to respective conductors on a surface of a second substrate by surface mount techniques with the first edge proximate and generally parallel to the surface of the second substrate and the first and second surfaces of the first substrate generally orthogonal to the surface of the second substrate.

In general, another aspect features a method that includes providing a first generally rectangular substrate having a thickness, a length and a width defining a first surface and a second surface generally parallel to the first surface. The first and second surfaces may be separated by the thickness. The substrate may comprise a plurality of conductive layers including conductive traces. The conductive layers may be separated by insulating layers. A plurality of surface contacts configured for mechanical and electrical connection to respective conductors on a surface of a second substrate may be provided along a first edge of the substrate. The first edge may be defined by the length and the thickness of the substrate. Electrical connections may be provided between selected conductive traces and selected surface contacts. A plurality of components may be mounted to the first substrate. The first edge of the substrate may be surface mounted to the surface of the second substrate with the first edge proximate and generally parallel to the surface of the second substrate and the first and second surfaces of the first substrate generally orthogonal to the surface of the second substrate.

Implementations of the apparatus or method may include one or more of the following features. The plurality of components may comprise semiconductor devices. The plurality of components may include a magnetically permeable core and selected conductive traces may form at least one winding magnetically coupled to the magnetic core. The substrate and components may be arranged to form a power converter. The length and thickness of the first substrate may be chosen relative to the width to provide a mechanically stable base for surface mount soldering the first substrate to the second substrate. The first edge of the first substrate and the surface contacts may have a width and length suitable to surface mount solder the power converter to the second substrate. The locations for mounting the plurality of components and the width, length, and thickness of the first substrate may be chosen to provide a mechanically stable platform for vertically surface mount soldering the first substrate to the second substrate.

The details of one or more embodiments of the invention are set forth in the accompanying drawings and in the detailed description below. Other features and advantages of the invention will be apparent and clearly understood by reference to the detailed description, to the drawings, and to the appended claims.

DESCRIPTION OF THE DRAWINGS

FIGS. 2A and 2B illustrate, respectively, a top perspective view and a bottom perspective view of an inductor module according to an embodiment of the invention;

FIG. 2C is a bottom view of the inductor module of FIGS. 2A and 2B;

FIG. 3D is a bottom view of the embodiment of the power converter of FIGS. 3A and 3B to illustrate the connectors and the footprint of the device;

FIG. 4 is a bottom view of the known power converter apparatus of FIG. 1A showing the connectors and the footprint of the apparatus.

Like reference numbers in the various drawings indicate like elements.

DETAILED DESCRIPTION

Figures 1A, 1B:
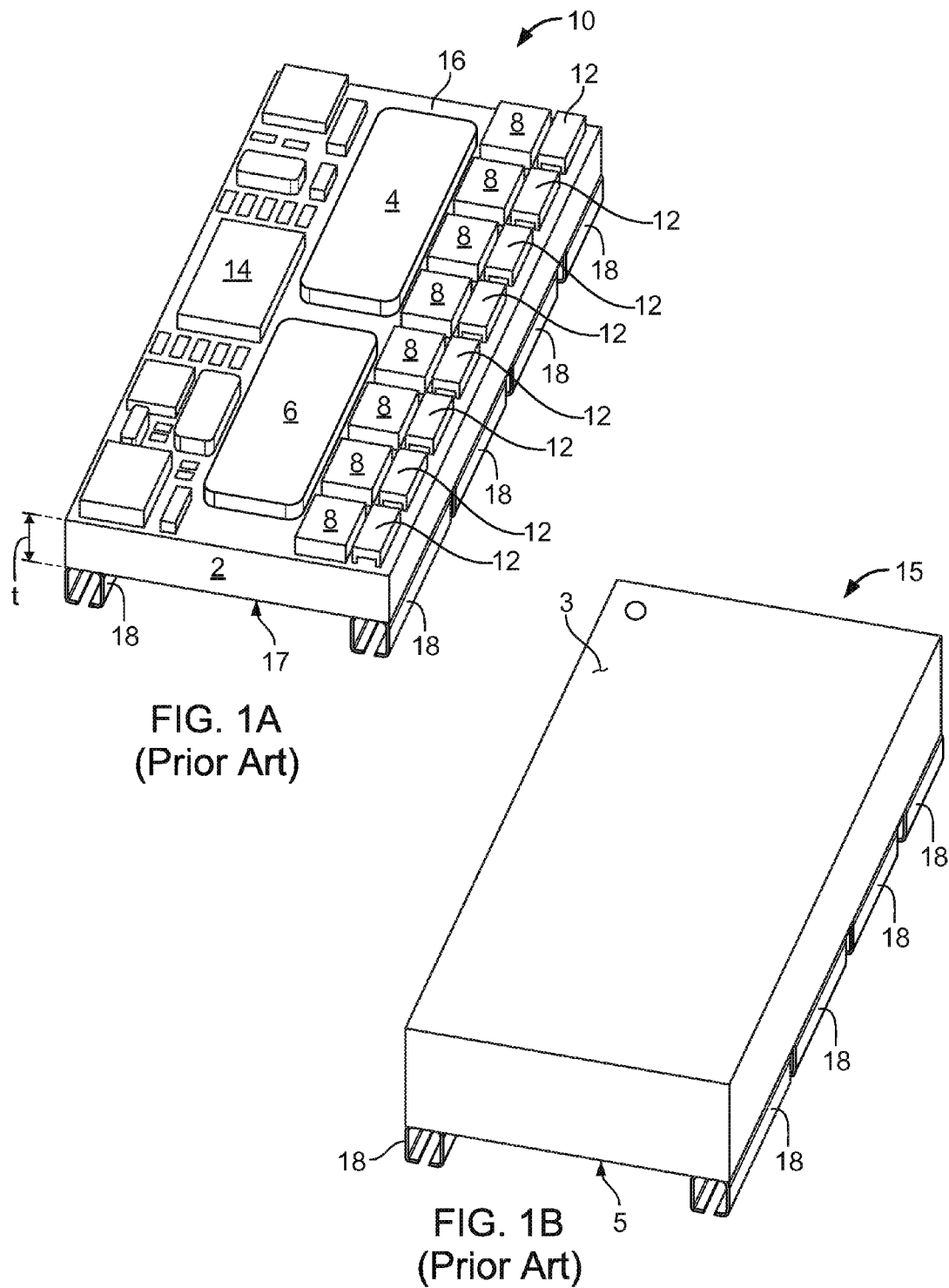
FIG. 1A is a top perspective view of a known power converter PCB assembly showing the components of the power converter.
FIG. 1B is a top perspective view of the power converter apparatus of FIG. 1A that has been over-molded with a thermally conductive epoxy material.

FIG. 1A is an enlarged, top perspective view of a power converter PCB apparatus 10 (not drawn to scale), which for example may be a sine amplitude converter ("SAC") similar to that disclosed in Vinciarelli, Factorized Power Architecture With Point of Load Sine Amplitude Converters, U.S. Pat. No. 6,930,893 ("the SAC Patent") (assigned to VLT, Inc., Sunnyvale, Calif. and incorporated here by reference). As described in the SAC Patent, a SAC module may include various power conversion components mounted to a top surface and to a bottom surface of a multilayer printed circuit board ("PCB").

Referring again to FIG. 1A, the power converter 10 may include a multilayer PCB 2 that supports magnetically permeable cores 4 and 6, which may include core legs (not shown) which may be inserted into holes (not shown) in the PCB 2. The cores may extend over the top surface 16 and bottom surface 17 (FIG. 4) of the PCB. The multilayer PCB 2 may be composed of multiple layers of conductive and non-conductive material, which may be in some applications, e.g. low voltage, high current output, as many as ten (10) or more layers. The layers of the multilayer PCB may contain conductive patterns that form windings of one or more transformers magnetically coupled to a respective core, e.g. transformer cores 4 and 6. The thickness and number of conductive turns in each winding and the number of windings in each transformer affect the width or thickness "t" of the PCB 2. The power converter apparatus 10 may also include other electronic components, e.g. surface mount devices (SMD's) such as MOSFET power switches 8, which may be connected to the windings of the transformers 4 and 6 via conductive traces (not shown) on the PCB 2. The MOSFET power switches 8 may be connected as primary switches to drive a winding of the transformer, or may be connected as secondary switches connected as synchronous rectifiers between a secondary and an output. Gate driver circuits 12 may be used to turn the respective switches 8 on and off. Control circuitry 14 may be provided within an integrated circuit, and the primary gate driver circuits 12 receive turn-on and turn-off command information from the control circuitry 14. Other SMD components, such as synchronous gate drivers, output capacitors, and heat dissipating elements (such as heat fins) may be arranged on the top surface 16 or on the bottom surface 17 of the multilayer PCB 2 as required. Interface contacts or terminals 18 on the bottom 17 of the PCB are provided for making electrical connections to conductive runs (or contacts) located on an external PCB (not shown). The external PCB may contain the load that requires specific low input voltages and high currents to power, for example, one or more microprocessors and memory devices. For example, the power converter apparatus 10 may be designed to operate with an input voltage of twenty-four (24) volts and provide an output of one (1) volt at eighty (80) amperes to a load.

FIG. 1B is a top perspective view of a power converter module 15 which includes the power converter apparatus 10 shown in FIG. 1A. In particular, the top surface 16 and the bottom surfaces 17 of the PCB 2 (see FIGS. 1A and 4) have been over-molded to form a module for mounting to an external PCB. For example, a thermally conductive epoxy can be used to encapsulate the PCB 2 and all of its components, including the inductors 4 and 6, which also extend from the bottom surface 17, to form parallelepiped upper portion 3 and lower portion 5, while leaving terminals 18 exposed for connection to traces or contacts (not shown) of an external PCB.

FIGS. 2A and 2B illustrate, respectively, a top perspective view and a bottom perspective view of an inductor module 20. The inductor module as shown includes a multilayer PCB 24 and magnetically permeable cores 22a, 22b, 22c and 22d. The magnetic cores 22a-22d may have magnetic permeable legs (not shown) that may be inserted into holes (not shown) in the PCB 24. As shown the portions of the magnetically permeable cores may extend over a first surface 21 and a second surface 23 of the multilayer PCB as depicted in FIG. 2A. During fabrication of the inductor module 20, the conductive layers of the multilayer PCB 24 may be etched to form conductive traces which are interconnected to form primary and optionally one or more secondary windings coupled to one or more of the cores. It will be appreciated that various core and winding configurations may be employed to form inductive components ranging from a simple inductor having a single winding and a single core to a complex transformer having a multiplicity of windings and cores. The characteristics such as the width and thickness of the conductive traces that form the windings, as well as the number of turns, may be selected to suit the transformation ratio and current requirements of the application. The number and thickness of the substrate layers, and thus the width "m" of the PCB 24, naturally will depend upon the requisite characteristics of the transformer or inductor.

The bottom edge surface 25 of the PCB 24 (see FIG. 2B) may include plated pads or contacts 26a to 26g to provide electrical connections to the inductive component, e.g. via conductive traces (not shown) electrically connected to the windings formed by the multilayer PCB. The number of such surface contacts and their dimensions are design choices, and may depend at least in part upon the load requirements. In FIGS. 2A to 2C, the plated pads 26a to 26g are flat and have the same width "m" as the PCB 24 to facilitate making secure and stable connections between the inductor module 20 and another PCB or substrate (such as a "motherboard", which will be described below with regard to FIG. 3A). In particular, the flat contacts 26a to 26g are arranged along the bottom edge surface 25 and are substantially planar to facilitate a stable mechanical connection along with a solid electrical connection when the inductor module 20 is surface mount soldered to a substrate. Thus, the inductor module 20 may be considered a surface mount device (SMD).

Figure 2D:
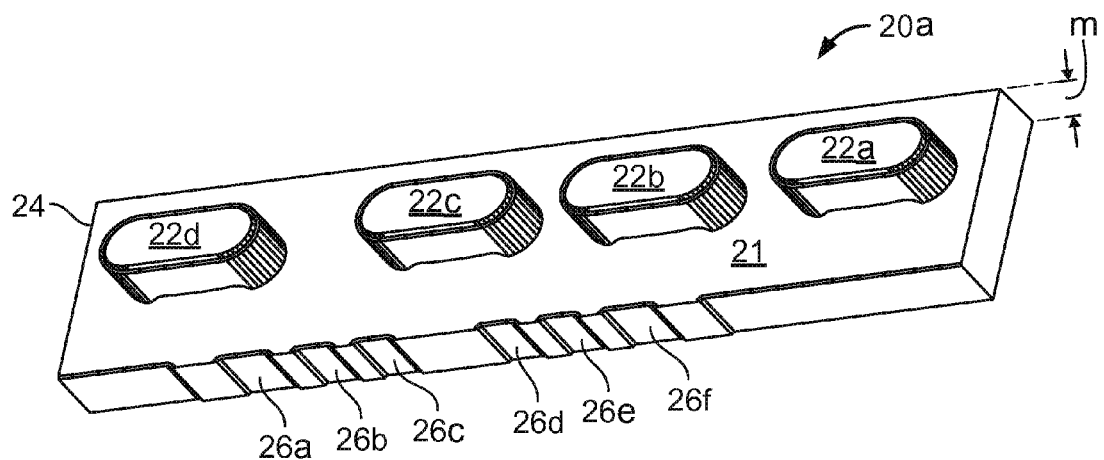
FIG. 2D is a side and bottom perspective view of an embodiment of an inductor module similar to that of FIGS. 2A to 2C.

Although shown as protruding from bottom edge surface 25 of PCB 24, surface contacts 26a-26g may alternatively be formed in recesses in bottom edge surface 25. FIG. 2D is a side and bottom perspective view of an inductor module 20a similar to that of FIGS. 2A to 2C, wherein like reference numbers indicate like elements. In FIG. 2D, the contacts 26a to 26f are in recesses on the bottom edge of the PCB 24 to accommodate solder for a solid connection to mating contacts (not shown) on another PCB. One way to make the recessed contacts 26a-26g is to form plated through holes or slots in the PCB 24 and which is cut or sawed along a line through the plated through-holes for example during singulation.

FIG. 2C is a bottom view of the embodiment of the inductor module 20 of FIGS. 2A and 2B, and dotted lines 27 have been added to depict the outline of an over-molding material, such as a thermally conductive epoxy, that could be used to encapsulate the inductor module 20. The flat contact pads 26a to 26g preferably are not covered by the epoxy material, i.e. they are preferably exposed for soldering to traces or contacts (not shown) on a substrate. In this embodiment, support pads 29a, 29b, 29c and 29d have been formed by utilizing the over-molding material, and these support pads are positioned near the far ends of the bottom of the PCB 24 (as shown) to provide additional mechanical stability when the inductor module 20 is surface mount soldered to another PCB. The support pads 29a to 29d may be the same height as the contacts 26a to 26g so as not to impede good electrical connections between the contacts 26a to 26g and the traces of another substrate during the surface mount soldering process. Alternately, the support pads 29a to 29d may be of another height so long as the contacts 26a to 26g remain unhindered from making good electrical connections to the traces on another substrate. In addition, more or less such support pads of differing dimensions could be utilized, and could be positioned in different locations along the bottom portion of the PCB 24 adjacent and/or between contact pads 26a to 26g to aid in providing a secure and stable mechanical connection. Further, support pads could be formed of other materials and be connected in alternate ways, and could serve a dual purpose. For example, metal plates for use as heat sinks could be attached to the top edge surface 28a and include side plates that extend downwards and may be attached to a front surface 28b and/or a rear surface 28c of the PCB 24. Such side plates may include support pads or support legs that extend past the bottom surface 25 of the PCB 24 to aid in providing a stable connection to an external substrate. Heat conducting plates (not shown) may also be used adjacent the flat surfaces of the core pieces to help conduct heat away from the cores.

Figure 3C:
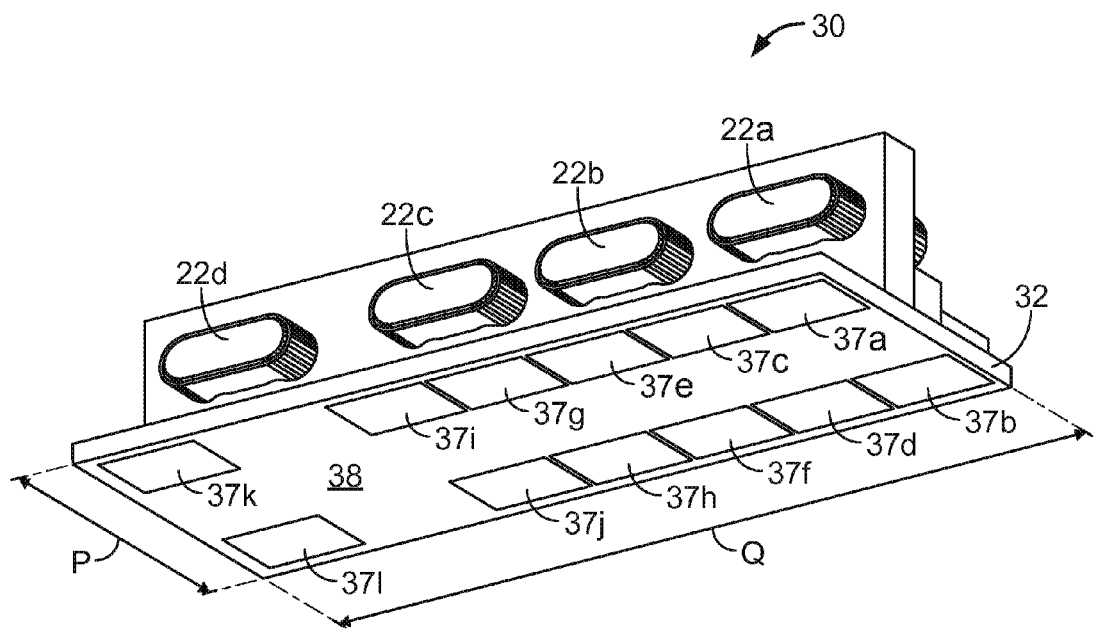
FIG. 3C is a bottom perspective view of the power converter apparatus of FIG. 3A according to an embodiment of the invention.
Figures 3A, 3B:
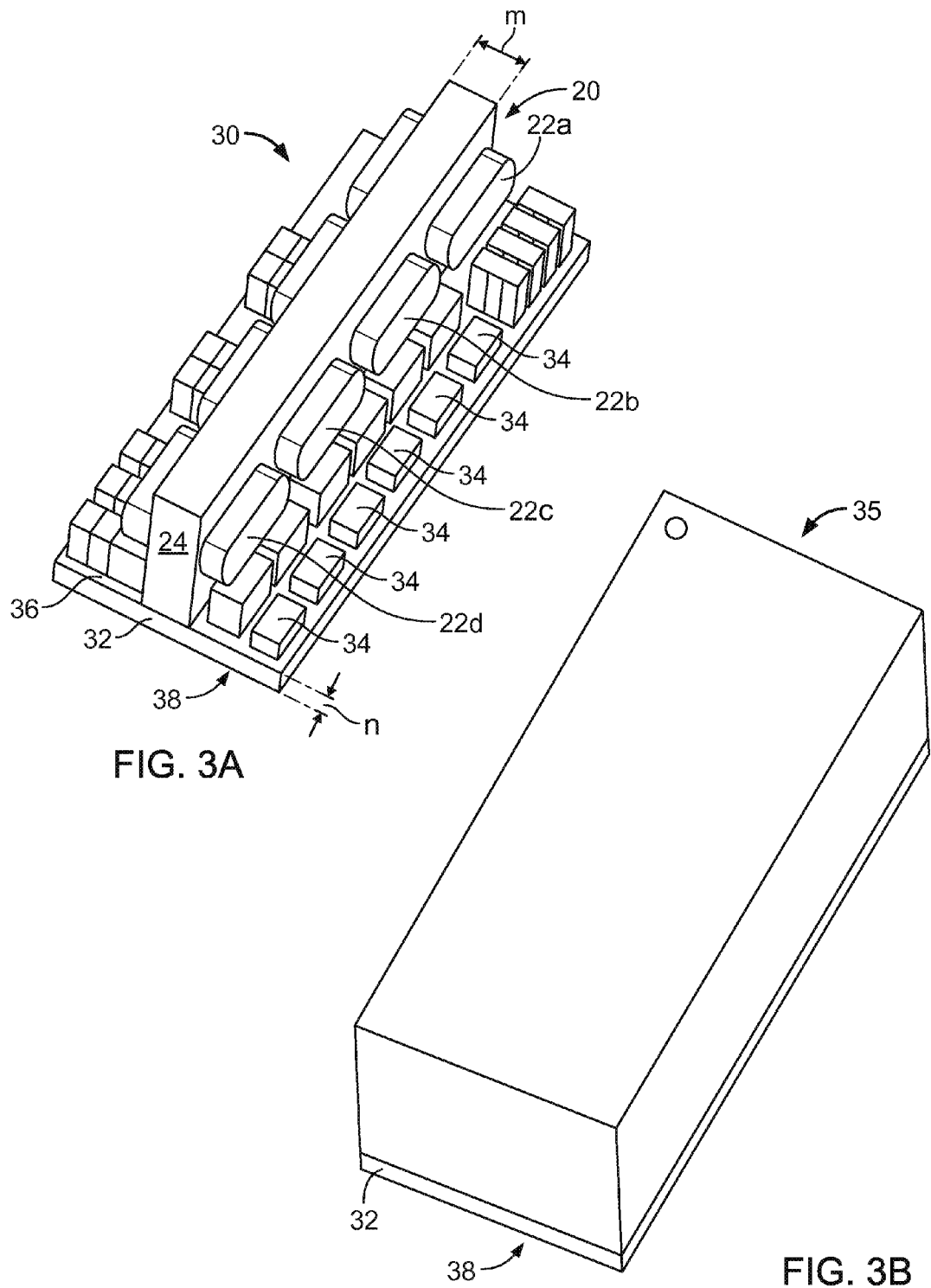
FIG. 3A is an enlarged, top perspective view of an embodiment of a high density power converter apparatus according to the invention.
FIG. 3B is a top perspective view of an embodiment of the power converter apparatus of FIG. 3A that has been over-molded with a thermally conductive epoxy material to form an inductor module according to the invention.

FIG. 3A is an enlarged, top perspective view of an improved, high density power converter apparatus 30, and FIG. 3B is a top perspective view of the power converter apparatus 30 of FIG. 3A that has been over-molded with a thermally conductive epoxy material to form a power converter module 35. In FIG. 3B, the conductive epoxy has been applied to only cover the components (including the inductor module 20) that are mounted on the top surface 36 of the PCB 32. Electrical contact pads (see reference numbers 37a to 37l shown in FIG. 3C) on the bottom surface 38 are left exposed.

Referring to FIG. 3A, an inductor module 20 discussed above with regard to FIGS. 2A and 2B is shown surface mount soldered to the top surface 36 of a substrate 32 along with other SMD's. In particular, the inductor module 20 is shown mounted vertically such that the multilayer PCB 24 is generally orthogonal (or substantially perpendicular) to the substrate 32. As discussed above, the width or thickness "m" of the multilayer PCB 24, including that of the flat contacts 26a to 26g and any support pads that may be present (see FIG. 2C), provides for a stable and secure connection (as a surface mount device) to the substrate 32. The inductor module 20 may comprise a transformer having one or more primary windings and one or more secondary windings adapted for use in a power converter.

The substrate 32, which may be referred to as a "motherboard," may include power conversion circuitry that is electrically connected to the inductor module 20 through the contact pads 26a to 26g (shown in FIGS. 2A to 2C). For example, power conversion circuitry such as MOSFET power switches 34 may be connected to traces (not shown) etched in one or more layers of the substrate 32, which in turn are connected to contacts (not shown) on the top surface 36 of the substrate 32. The substrate contacts on the top surface 36 may be soldered to the contact pads 26a to 26g on the bottom edge surface 25 of the inductor module 20 via a surface mount soldering process. The MOSFET power switches may be thus connected to respective winding of the transformer in inductor module 20 via etched conductive traces (not shown) in one or more layers of the PCB 24. Other circuitry, such as primary gate driver circuits, control circuitry, synchronous gate drivers, output capacitors, and heat dissipating elements may also be arranged on the top surface 36 of the substrate 32 as required.

FIG. 3C is a bottom perspective view of the power converter apparatus 30 of FIG. 3A depicting terminals 37a to 37l arranged on the bottom surface 38 for connection to contacts of an external PCB. As shown, the substrate 32 has a width "P" and a length "Q", and the terminals 37a to 37l may be generally planar pads (or flat contacts) for making stable mechanical and electrical connections between the power converter 30 and conductive traces or contacts on a surface of an external PCB (such as a customer board, not shown). It should be noted that using the vertical surface mount PCB inductor (FIGS. 2A to 2D) in the two PCB design (FIGS. 3A to 3D) allows all components to be surface mount soldered to the top surface 36 of PCB 32 with no components extending past or overhanging the bottom surface 38, allowing the complete power converter apparatus 35 to be a SMD for connection to an external board. The customer or external PCB may provide the required input voltage(s) to, for example, terminals 37k and 37l, and may receive various low voltage and high current combination outputs from terminals 37a to 37j for input, for example, to one or more microprocessors and memory devices.

FIG. 3D is a bottom view of the power converter apparatus 30 of FIGS. 3A to 3C, showing the terminals 37a to 37l arranged on the bottom surface 38 of the substrate 32. As shown, the substrate 32 has a width "P" and a length "Q" that define a footprint for the power converter 30.

FIG. 4 is a bottom view 40 of the power converter apparatus 10 of FIG. 1A showing the terminals 18 and the transformer core sets 4 and 6 extending out from the bottom surface 17 of PCB 2. The lengths "S" and "Q" of the two converters, 40 and 30, and their respective PCBs, 2 and 32, shown in FIGS. 4 and 3D respectively are substantially the same. However, the width "R" of power converter 40 and its PCB 2 is substantially greater, e.g. by as much as 50%, than the width "P" of converter 30 and its PCB 32. Accordingly, the footprint of power converter 30 (and power converter module 35) is smaller than the footprint of a comparable conventional power converter. The reduction in the footprint of the power converter 30 over traditional single PCB converters may be attributable to the reduction in area required on the main converter PCB by traditional magnetic components. The vertical surface mount inductor/transformer may therefore be used to reduce the converter footprint, which is advantageous particularly where PCB area is at a premium, e.g. at the point of load or near high value components such as microprocessors. The vertical surface mount PCB component enables more efficient utilization of the area on the internal power converter PCB 32 and on the external system PCB, i.e. the customer's PCB, and thus is advantageous for use in compact power converters including, low voltage and high current output applications.

The vertical PCB component may also enable fabrication of lower cost power converters. In particular, as discussed above, the number of conductive layers "L" of the PCB 24 (see FIGS. 2A to 2C) depends on the number of windings required for the magnetic cores of inductors 22a-22d. The transformer has been relocated from substrate 32 (where it resides in the prior art device 40) to the inductor module 20 in the improved power converter 30. Because the number "M" of conductive layers required to form electrical interconnections between the various SMD's (surface mount devices) is less than the number, L, of layers required to form the transformer, the PCB 32 may be fabricated using fewer layers which reduces the cost of the power converter and results in a thinner PCB. For example, in some high current applications the inductor PCB 24 may include fourteen to sixteen layers, whereas the substrate 32 may only require two to six layers for making interconnections between power conversion electrical components. Thus, as depicted in FIG. 3A, the width "n" of the PCB 32 is thinner than the width "m" of the PCB 24. Therefore, the PCB 24 can be designed to efficiently utilize the required number of layers to accommodate the windings for the inductive component 20 without having to provide additional conductive materials (such as copper) for areas in the layers that may not be fully utilized by any other components. The two PCB configuration thus eliminates waste because the multilayer substrate 32 containing, for example, power converter SMD's can utilize less conductive material for making interconnections. The degree of difficulty of power converter design is also reduced by the two PCB configuration, as it is simpler to interconnect the SMD's of PCB 32 when no inductors are present.

Consequently, the cost to manufacture the power converter 30 or power converter module 35 of FIGS. 3A to 3C (a two PCB design consisting of a vertical mount inductor assembly surface mounted on a substrate) is less than that of manufacturing conventional single PCB power converters (like that shown in FIG. 1A). In addition, since the substrate 32 includes all of the SMD's on a top surface, the power converter apparatus can be surface mount soldered to an external board (such as a customer board).

The vertical PCB inductors and transformers may be manufactured in quantity by assembling permeable cores onto relatively large PCB panels comprising many inductors which may then be over-molded (if needed) and then singulated, i.e. cut or sawed into individual components such as those shown in FIGS. 2A to 2D.

Although shown incorporated into a surface mount power converter module 30, 35 in FIGS. 3A to 3D, the vertical surface mount PCB inductor may be advantageously used as a discrete component in other applications. For example, multi-phase buck regulators are commonly used at the point of load to supply low voltage, e.g. 1V and less, loads from an intermediate bus voltage, e.g. 12V. A vertical surface mount PCB inductor module 20, 20A (FIGS. 2A to 2D) comprising a plurality of individual inductors, e.g. 4, 8, or more, may provide a compact cost-effective solution in such applications. The vertical surface mount inductor module 20, 20a can therefore also reduce the area required on the motherboard at the point of load in discrete applications particularly when combined with highly integrated components such as the commonly available multi-phase buck controllers. In some applications, e.g. the multi-phase buck application, one terminal of each of the individual inductors may be connected to a common terminal e.g. terminals 26a-26g in FIGS. 2B and 2D.

The vertical surface mount component need not be limited to inductive components. For example, other electronic components or subsystems may be formed on or mounted to a vertical substrate such as PCB 24 (FIG. 2A) which may then be surface mount soldered to a main PCB to reduce the surface area required on the main PCB.

Figure 5:
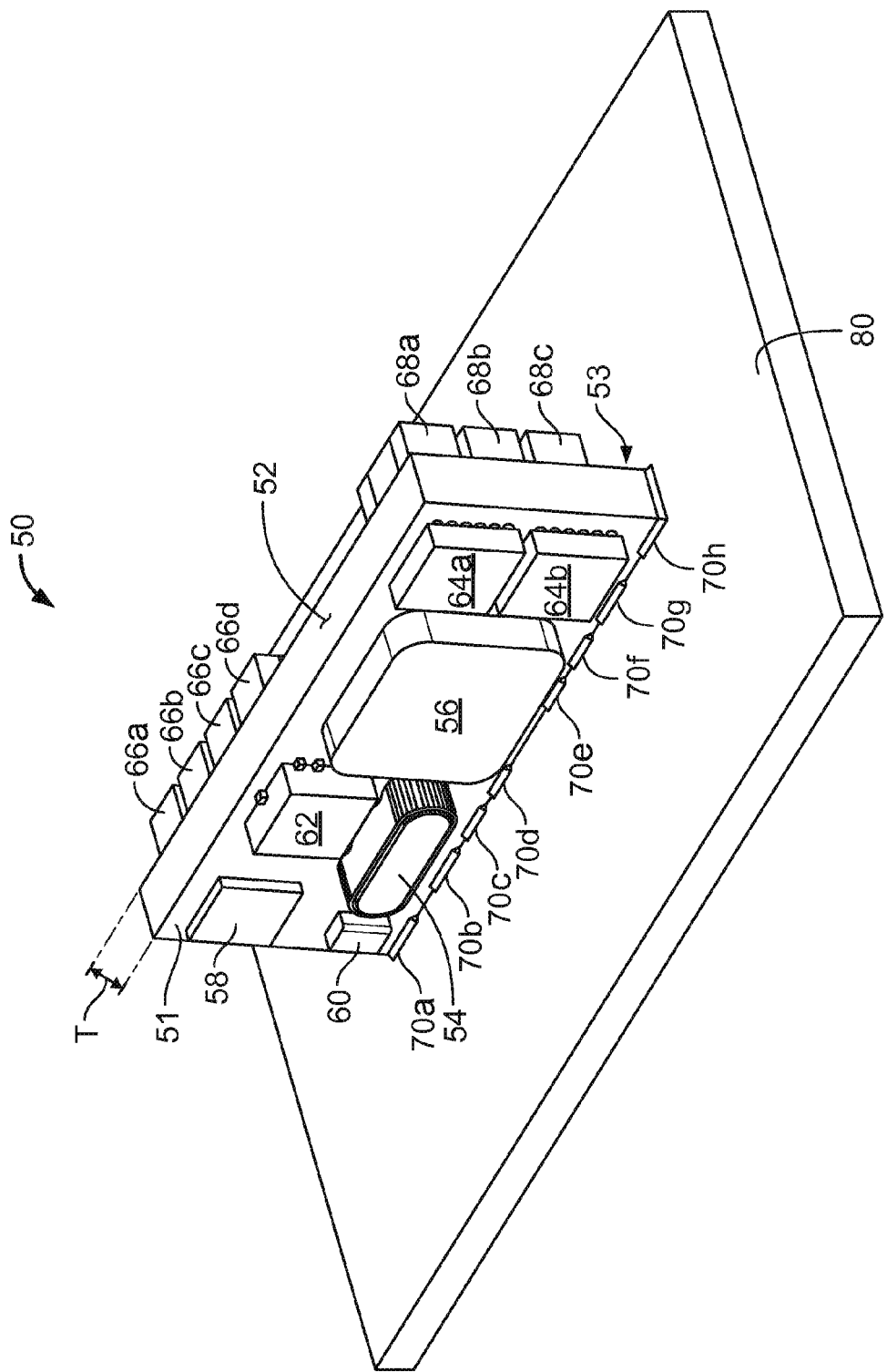
FIG. 5 is a perspective view of a vertical PCB power converter apparatus according to the invention that is surface mount soldered to a motherboard.

Referring to FIG. 5, one such example is shown in perspective view. A vertical surface-mount substrate power converter 50 is shown surface mount soldered to a main PCB 80, which for example may be a customer motherboard. In this example, the power converter apparatus 50 includes a multilayer PCB 52 and two transformers: a drive transformer 54, and a power transformer 56. The drive transformer 54 and the power transformer 56 may include magnetic permeable legs (not shown) that are inserted into holes (not shown) in the PCB 52. The drive transformer and the power transformer may include portions that extend from the first surface 51 and from the opposite, second surface 53 of the PCB 52. Other components may also be surface mount soldered to the first surface 51 or to the second surface 53 of the PCB 52. For example, integrated control circuits 58 and 60, input field effect transistors (FET's) 62, and output FET's 64a and 64b are shown surface mount soldered to the surface 51. In addition, additional components, such as input capacitors 66a to 66d and output capacitors 68a to 68c, have been surface mount soldered to the second surface 53.

During fabrication of the power converter 50, the conductive layers of the PCB 52 may be etched to form conductive traces which are interconnected to form primary, and optionally, secondary windings that may be coupled to the magnetic permeable cores of the drive transformer 54 or to the power transformer 56. Various core and winding configurations could be used to form these transformer components, and the characteristics such as width and thickness of the conductive tracings that form the windings, as well as the number of turns, may be selected to suit the transformation ratio and current requirements of the application. Thus, the number of substrate layers, and thus the thickness "T" of the PCB 52 may depend upon the required characteristics of one or both of the transformers.

The bottom edge surface (not shown) of the PCB 52 may include plated pads or surface contacts (not shown) such as the those illustrated in FIG. 2 to provide electrical connections between the power converter and external circuitry, e.g. power source, load, and supervisory circuitry, via conductive traces (not shown). The number of such pads or contacts and their dimensions are design choices, and may depend at least in part upon the load requirements. The plated pads may be generally planar or flat, and may be substantially the same width "T" as the PCB 52 to facilitate making secure and stable mechanical and electrical connections between the inductor module 50 and the customer PCB 80. Surface mount solder connections 70a to 70h are depicted in FIG. 5, and it should be understood that the width of the plated pads may be slightly wider or thinner as long as a secure and stable connection can be achieved between the power converter 50 and the customer PCB 80.

A number of embodiments of the invention have been described. Nevertheless, it will be understood that various modifications may be made without departing from the spirit and scope of the invention. Accordingly, other embodiments are within the scope of the following claims.

What is claimed is:

1. Apparatus comprising:
an inductor having a magnetic core; and
a multilayer PCB, the PCB including conductive traces that form at least one winding coupled to the magnetic core and contacts electrically connected to the conductive traces for making connections between the at least one winding and a substrate, wherein the contacts are arranged along and on the surface of one edge of the PCB, the edge being defined by the length and the thickness of the multilayer PCB, and wherein the edge is sufficiently wide to permit stable connection of the inductor to the substrate in a generally orthogonal orientation.

2. The apparatus of claim 1 wherein the at least one winding comprises a primary winding and a secondary winding, and wherein the inductor is a transformer.

3. The apparatus of claim 1 wherein the contacts are surface mount soldered to the substrate.

4. The apparatus of claim 1 further comprising a thermally conductive material encapsulating the core and the PCB but leaving the contacts exposed.

5. The apparatus of claim 1 further comprising a substrate including power conversion circuitry and terminals, wherein the power conversion circuitry is electrically connected to the inductor for converting power from an input source for delivery to a load, and wherein the substrate comprises a number, M, of conductive layers for forming interconnections, and the multilayer PCB comprises a number, L, of conductive layers.

6. The apparatus of claim 5 wherein L is greater than M.

7. The apparatus of claim 5 wherein M is greater than L.

8. The apparatus of claim 5 further comprising a thermally conductive material on a top surface of the substrate, wherein the material encapsulates the core, the multilayer PCB and the power conversion circuitry.

9. The apparatus of claim 1 further comprising at least one support pad provided on the edge of the PCB adjacent the contacts.

10. A method comprising:
providing an inductor having a magnetic core; and
providing a multilayer PCB, the PCB including conductive traces that form at least one winding coupled to the magnetic core and contacts electrically connected to the conductive traces for making connections between the at least one winding and a substrate, wherein the contacts are arranged along and on the surface of one edge of the PCB, the edge being defined by the length and the thickness of the multilayer PCB, and wherein the edge is sufficiently wide to permit stable connection of the inductor to the substrate in a generally orthogonal orientation.

11. The method of claim 10 wherein the at least one winding comprises a primary winding and a secondary winding, and wherein the inductor is a transformer.

12. The method of claim 10 wherein the contacts are surface mount soldered to the substrate.

13. The method of claim 10 further comprising providing a thermally conductive material encapsulating the core and the PCB but leaving the contacts exposed.

14. The method of claim 10 further comprising providing a substrate including power conversion circuitry and terminals, wherein the power conversion circuitry is electrically connected to the inductor for converting power from an input source for delivery to a load, and wherein the substrate comprises a number, M, of conductive layers for forming interconnections, and the multilayer PCB comprises a number, L, of conductive layers.

15. The method of claim 14 wherein L is greater than M.

16. The method of claim 14 wherein M is greater than L.

17. The method of claim 14 further comprising providing a thermally conductive material on a top surface of the substrate, wherein the material encapsulates the core, the multilayer PCB and the power conversion circuitry.

18. The method of claim 10 further comprising providing at least one support pad provided on the edge of the PCB adjacent the contacts.

19. A method comprising:
operating an electric device comprising:
an inductor having a magnetic core; and
a multilayer PCB, the PCB including conductive traces that form at least one winding coupled to the magnetic core and contacts electrically connected to the conductive traces for making connections between the at least one winding and a substrate, wherein the contacts are arranged along and on the surface of one edge of the PCB, the edge being defined by the length and the thickness of the multilayer PCB, and wherein the edge is sufficiently wide to permit stable connection of the inductor to the substrate in a generally orthogonal orientation.

20. The method of claim 19 wherein the at least one winding comprises a primary winding and a secondary winding, and wherein the inductor is a transformer.

* * * * *